United States Patent [19]

Solomon

[11] Patent Number: 5,053,350
[45] Date of Patent: Oct. 1, 1991

[54] METHOD OF MAKING TRENCH MOSFET CAPACITOR CELL FOR ANALOG SIGNAL PROCESSING

[75] Inventor: Allen L. Solomon, Fullerton, Calif.

[73] Assignee: Grumman Aerospace Corporation, Bethpage, N.Y.

[21] Appl. No.: 683,509

[22] Filed: Apr. 8, 1991

Related U.S. Application Data

[63] Continuation of Ser. No. 327,688, Mar. 23, 1989, abandoned.

[51] Int. Cl.⁵ .............................................. H01L 21/70
[52] U.S. Cl. ........................................ 437/47; 437/38; 437/40; 437/60; 437/203; 437/228; 437/919
[58] Field of Search ....................... 437/38, 47, 52, 60, 437/203, 228, 233, 235, 919, 29, 40, 41; 357/236, 51; 156/643, 644; 365/188

[56] References Cited

U.S. PATENT DOCUMENTS

| 4,651,184 | 3/1987 | Malhi | 357/23.6 |
| 4,672,410 | 1/1987 | Miurci et al. | 357/23.6 |
| 4,673,962 | 6/1987 | Chattery et al. | 357/23.6 |
| 4,830,978 | 5/1989 | Temg et al. | 357/23.6 |

FOREIGN PATENT DOCUMENTS

| 0282716 | 9/1988 | European Pat. Off. | 437/203 |
| 0141262 | 8/1988 | Japan | 357/23.6 |
| 0227050 | 9/1988 | Japan | 437/52 |
| 1-86561 | 3/1989 | Japan | |

OTHER PUBLICATIONS

R. Gegorian and G. C. Temes, Analog MOS Integrated Circuits For Signal Processing, pp. 98, 99, John Wiley & Sons, NY, NY (1986).

Primary Examiner—Brian E. Hearn
Assistant Examiner—Tom Thomas
Attorney, Agent, or Firm—Stetina and Brunda

[57] ABSTRACT

A process for forming a single trench MOS transistor/capacitor cell for analog signal processing, and the resulting structure, are disclosed. The transistor is formed by foming a first trench in the semiconductor substrate, lining the trench with a layer of insulating material, a layer of conducting material, and filling the trench with a layer of insulator. A doped region is formed adjacent the trench, which serves as a transistor source. A second trench is then formed which extends through and excavates a portion of the first trench. The second trench is lined with a layer of doped material and insulator. The doped material is isolated from the conductive layer lining the first trench. The second trench is then filled with a body of conductive material. The layer of doped material lining the second trench serves as the transistor drain and a capacitor output is extracted from the body of conductive material. The resulting structure acts as a trench gate MOS transistor having a capacitor output in series with the transistor drain. Further, a process is disclosed to include a trench gate complementary transistor in an adjacent trench structure. A complementary transistor circuit with a series connected capacitor is thereby obtained.

19 Claims, 3 Drawing Sheets

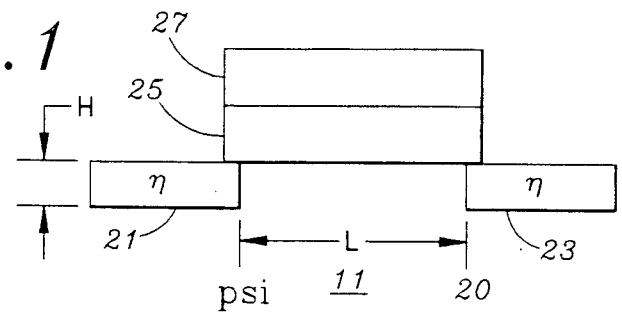
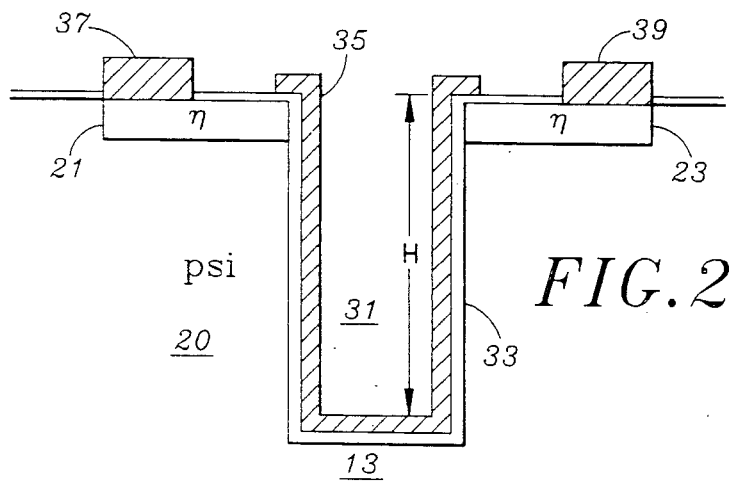
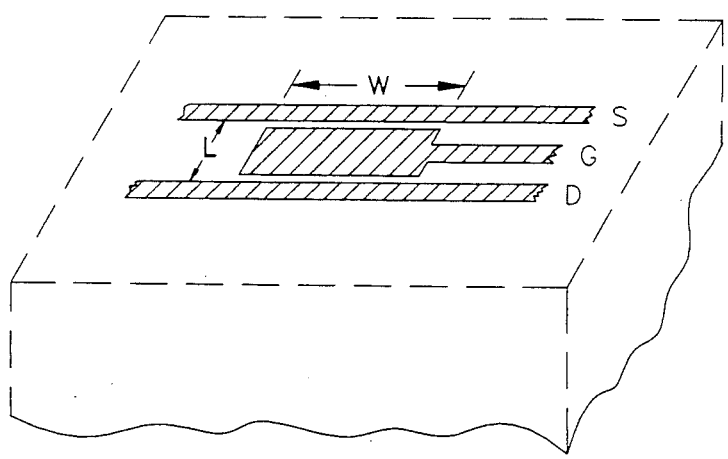

METHOD OF MAKING TRENCH MOSFET CAPACITOR CELL FOR ANALOG SIGNAL PROCESSING

This is a continuation of copending application Ser. No. 07/327,688 filed on Mar. 23, 1989 now abandoned.

BACKGROUND OF THE INVENTION

The present invention finds application in connection with thin silicon plates or wafers formed to support a multiplicity of monolithically integrated data processor circuits. More particularly, the invention is directed to the production of circuits formed on silicon wafers for interfacing devices such as infrared detector elements to a processing network that amplifies, stores and interprets detected infrared frequency signals.

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of infrared detectors is to respond to the energy of a wavelength within some particular portion of the infrared region.

Heated objects generate radiant energy having characteristic wavelengths within the infrared spectrum. Many current infrared image detection systems incorporate arrays with large numbers of discrete, highly sensitive detector elements, the electrical outputs of which are connected to processing circuitry. By analyzing the pattern and sequence of detector element excitation, the processing circuitry can identify and track sources of infrared radiation. Though the theoretical performance of such contemporary systems is satisfactory for many applications, it is difficult to construct structures that adequately interface large numbers of detector elements with associated circuitry in a practical and reliable manner. Consequently, practical applications for contemporary infrared image detector systems have necessitated further advances in the areas of miniaturization of the detector array and accompanying circuitry, of minimization of circuit generated noise that results in lower sensitivity of the detected signal, and of improvements in the reliability and economical production of detector arrays and the accompanying circuitry.

Contemporary arrays of detectors, useful for some applications, may be sized to include 256 detector elements on a side, or a total of 65,536 detectors, the size of each square detector being approximately 0.009 centimeters on a side, with 0.00116 centimeters spacing between detectors. Such a subarray would therefore be 2.601 centimeters on a side. Interconnection of such a subarray to processing circuitry would require connecting each of the 65,536 detectors to processing circuitry within a square, a little more than one inch on a side. Each subarray may, in turn, be joined to other subarrays to form an array that connects to 25,000,000 detectors or more. As would be expected considerable difficulties are presented in electrically connecting the detector elements to associated circuitry, and laying out the circuitry in a minimal area. The problems of forming processing circuitry in such a dense environment require minimization of the surface area used for the circuitry.

The outputs of the detector elements typically undergo a series of processing steps in order to permit derivation of the informational content of the detector output signal. The more fundamental processing steps, such as preamplification, tuned band pass filtering, clutter and background rejection, multiplexing and fixed noise pattern suppression, are preferably done at a location adjacent the detector array focal plane. As a consequence of such on-focal plane, or up-front signal processing, reductions in size, power and cost of the main processor may be achieved. Moreover, on-focal plane signal processing helps alleviate performance, reliability and economic problems associated with the construction of millions of closely spaced conductors connecting each detector element to the signal processing network.

Aside from the aforementioned physical limitations on the size of the detector module, limitations on the performance of contemporary detection systems can arise due to the presence of electronic circuit generated noise in particular, from the preamplifier. Such noise components can degrade the minimal level of detectivity available from the detector.

A type of noise that is particularly significant where the preamplifier operates at low frequency is commonly called flicker or 1/f noise. Because 1/f noise can be the principal noise component at low frequencies of operation, it is highly desirable that circuits operating within such frequencies be constructed in such a manner as to decrease 1/f noise to an acceptably low level.

U.S. Pat. No. 4,633,086, to Parrish, Input Circuit For Infrared Detector, assigned to the common assignee, describes one technique for biasing the on-focal-plane processing circuit to maintain the associated detector in a zero bias condition, thus reducing 1/f noise and enhancing the signal to noise ratio of the circuit.

Reduction of 1/f noise in the preamplifier, where the preamplifier transistor is a field effect device, is conventionally obtained by increasing the area of the channel region under the gate. This large area over the semiconductor substrate surface results in a decrease in circuit component density or decreased circuit component miniaturization. In the present invention, the channel region of a metal-oxide-semiconductor (MOS) field effect transistor is formed in a trench in the semiconductor. The transistor then occupies far less semiconductor substrate surface and so enables a high component density circuit to be obtained.

SUMMARY OF THE INVENTION

A process for forming a single trench MOS field effect transistor/capacitor cell for analog signal processing, field effect and the resulting structure, are disclosed. The transistor is formed by forming a first trench in the semiconductor substrate, lining the trench with a layer of insulating material, a layer of conducting material, and filling the trench with a layer of insulator. A doped region is formed adjacent the trench, which serves as a transistor source. A second trench is then formed which extends through and excavates a portion of the first trench. The second trench is lined with a layer of doped material and insulator. The doped material is isolated from the conductive layer lining the first trench. The second trench is then filled with a body of conductive material. The layer of doped material lining the second trench serves as the transistor drain and a capacitor electrode. The conductive trench fill serves as the capicitor counterelectrode. The resulting structure acts as a trench gate MOS transistor having a capacitor output in series with the transistor drain.

In the presently preferred embodiment the first trench is formed to be up to approximately 10 to 20 microns deep, 2 to 3 microns wide and 10 to 20 microns long.

Both first and second trenches may be formed by reactive ion etching of the substrate. The insulating layers may be formed by thermally oxidizing the exposed silicon substrate or exposed layer of silicon, or by vapor deposition of an insulator. The doped region may be formed by diffusing dopants into the semiconductor substrate. The layer of conductive material may be formed by vapor deposition. The body of insulating material preferably fills the first trench completely, and the body of conductive material preferably fills the second trench completely.

The inventive concepts of the invention may be extended by forming a second trench gate complementary MOS transistor within the substrate adjacent the integral transistor/capacitor and the second transistor to form complimentary trench gate MOS transistors having a capacitor in series with the interconnected drain terminals of both the integral transistor/capacitor and the transistor.

The second transistor may be constructed by forming a third trench in the semiconductor substrate adjacent the second trench. Second and third doped regions may be formed adjacent the upper surface of the substrate on opposite sides of the third trench. A second layer of doped material may be formed about the third trench, and about the second and third regions, isolating the second and third doped regions from the substrate. A layer of of insulator may be formed within the third trench upon the second layer of doped material, and the trench may then be filled with a body of conductive material upon the second insulating layer.

The second and third regions may be viewed as source and drain regions, respectively, of the second transistor, and the body of conductive material forming the second transistor gate. The drain and gate regions of the integral transistor/capacitor and the second transistor may be interconnected to provide complimentary trench gate MOS transistors, having a capacitor in series with the interconnected drain terminals.

In the presently preferred embodiment the third trench may be formed to be between 5 to 25 microns deep, 2 to 5 microns wide and 10 to 20 microns long.

BRIEF DESCRIPTION OF THE DRAWINGS

FIG. 1 is a cross-sectional view of a contemporary MOS transistor structure;

FIG. 2 is a cross-sectional view of a transistor formed in accordance with the present invention;

FIG. 3 is a top perspective view of the transistor illustrated at FIG. 2;

DETAILED DESCRIPTION OF THE PRESENTLY PREFERRED EMBODIMENT

Figure 4:
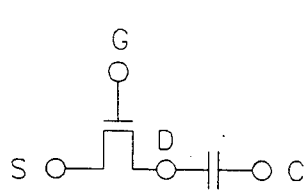
FIG. 4 is a schematic representation of a contemporary processing circuit element including an MOS transistor and a series capacitor.

The detailed description set forth below in connection with the appended drawings is intended as a description of the presently preferred embodiment of the invention, and is not intended to represent the only form in which the present invention may be constructed or utilized. The description sets forth the functions and sequence of steps for construction of the invention in connection with the illustrated embodiment. It is to be understood, however, that the same or equivalent functions and sequences may be accomplished by different embodiments that are also intended to be encompassed within the spirit and scope of the invention.

As previously noted large numbers of closely spaced high component density, integrated circuit processor channels may be used in on-focal-plane signal processors. Each detector element in the detector array may be connected to a preamplifier, such as a CMOS preamplifier, in an analog processor circuit. Low preamplifier noise is essential to prevent degradation of detector sensitivity. Since the preamplifiers are operated at low frequency, a principal source of noise is flicker or 1/f noise. The 1/f noise is inversely proportional to the area of the channel or gate regions of an MOS transistor, as expressed in the following equation:*

$$v^{-2} = \frac{K\Delta f}{C_{ox}^{W L f}},$$

where
v = the characteristic noise in microvolts;
K = a constant;
$\Delta f$ = bandwidth
f = the frequency of operation;
$C_{ox}$ = characteristic capacitance of the oxide layer;
W = the width of the gate; and
L = the length of the gate.

*See: R. Gregorian and C. C. Temes, *Analog MOS Integrated Circuits For Signal Processing*, pp. 98, 99, John Wiley & Sons, N.Y., N.Y. (1986)

A large area gate region in a MOS transistor will produce a low 1/f noise component. However, such a structure requires a large amount of semiconductor surface area. This makes it difficult to obtain a high density of such integrated circuit functions. The present invention is directed to a structure and process for enhancing the area of the gate region without enhancing the semiconductor surface area.

The MOS transistor gate region may be regarded as a capacitor, which is formed by a metal oxide semiconductor cross section. Large area capacitors that preserve semiconductor surface are obtained in bulk silicon by using the walls of trenches, grooves or holes, which are cut in silicon, for example, by plasma or reactive ion etching. In such a manner, gate region area may be enhanced by using the depth of the trench to enlarge the electrode channel area without the need to use a large amount of the semiconductor surface. The present invention recognizes the capacitive characteristics of the MOS transistor gate region and applies particular trench forming techniques to the construction of the MOS transistor. In such a manner the MOS transistor gate channel area or gate channel region, is enhanced, mitigating 1/f noise, without the need to use large amounts of the semiconductor surface.

FIG. 1 illustrates an n-MOS transistor constructed in accordance with conventional techniques. As shown therein MOS transistor 11 is formed of an n-doped source region 21 and an n-doped drain region 23 formed in p-doped silicon 20. The source and drain regions are bridged by an insulating layer, e.g. insulating layer 25, which may be formed of material such as silicon dioxide ($SiO_2$) or silicon nitride. A conductive gate 27 is disposed on the upper surface of the insulator 25. The gate 27 is typically formed of metal or doped polysilicon.

In relation to FIG. 1 the characteristic 1/f noise is related to the width and length of the gate area intermediate the source and drain. The length of the gate area, labeled L, is shown at FIG. 1. The width of the gate area is orthogonal to the plane of the drawing. By increasing the length of the gate L, 1/f noise is reduced, though the maximum speed at which the circuit will efficiently operate is reduced. The present invention is directed to a construction and technique wherein the gate area is enhanced without the need to appropriate greater surface area of the semiconductor wafer.

FIG. 2 illustrates one embodiment of the present invention. As with MOS transistor 11 shown at FIG. 1, MOS transistor 13 comprises an n-doped source region 21, and an n-doped drain region 23, both formed in p-doped silicon 20. Unlike the construction shown at FIG. 1, a trench 31 is formed in the silicon substrate. The trench may be formed by any of a variety of techniques, such as reactive ion etching. An insulating layer 33 is disposed on the vertical and bottom surface of the trench 31. In the presently preferred embodiment the insulating layer 33 is a thin film of silicon dioxide formed by thermal oxidation of the silicon. A conductive film 35, which serves as the gate, is then disposed on the upper surface of insulating layer 33. The gate layer 35 may be formed of conductive material, such as metal or of degenerately doped semiconductor material, e.g. polysilicon. In alternative structure the trench can be filled with an insulator material such as $SiO_2$ or with a conductive material without the need for a conductive film liner. Electrodes 37, 39 may be formed on the upper exposed surfaces of source 21 and drain 23, respectively. Where the insulating layer 33 extends above the surfaces of source 21 and drain 23, the $SiO_2$ may be etched by any of a number of contemporary techniques to facilitate the formation of the electrodes. An additional electrode (not shown) may be formed to facilitate contact with the gate layer 35.

In accordance with the construction shown at FIG. 2 the gate region intermediate to the source 21 and drain 23 is enlarged by means of a formation of trench 31. In an the presently preferred embodiment trench 31 is formed to be up to approximately 10 to 20 microns deep and 2 to 3 microns wide. The length of the trench (orthogonal to the plane of FIG. 1) is up to the range of 10 to 20 microns. The particular dimensions may be selected in accordance with the desired noise characteristics and speed of the transistor, and the available surface area.

A perspective view of a MOS transistor formed in accordance with FIG. 2 is illustrated at FIG. 3. FIG. 3 illustrates the arrangement of source, gate, and drain electrodes on the semiconductor substrate surface. A filled trench is depicted.

It is anticipated that the gate would be connected to a dedicated detector element and the drain to a storage capacitor which may be selectively interrogated by the further processing circuitry (not shown). The source may be connected to a low level bias circuit, or alternatively may be sustained at a substantially zero level, as may be desired.

The construction illustrated at FIGS. 2 and 3, therefore provides advantages of low 1/f noise without the penalty in terms of semiconductor surface area. Though certain penalties may be inherited in terms of the speed of the MOS transistor, in certain applications the speed limitations are not restrictive. On the contrary, 1/f noise reduction is needed in low speed imaging systems, for example, for highest sensitivity.

Figure 5:
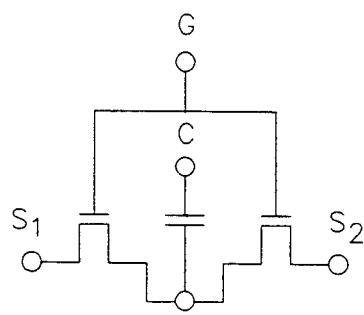
FIG. 5 is a schematic representation of a contemporary processing circuit of CMOS transistors and a series capacitor.
Figure 6:
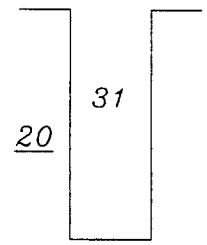
FIGS. 6–15 illustrate the construction of a single trench MOSFET capacitor cell for analog signal processing in accordance with the schematic representation of FIG. 4.
Figure 7:
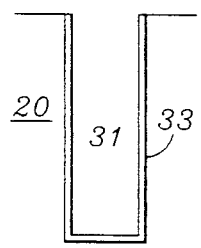
Figure 8:
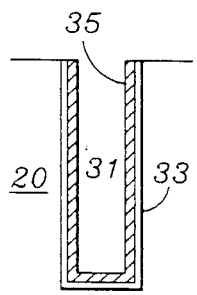

The present invention further expands beyond the unique aspects of the trench gate MOS transistor by providing for the integration of the series capacitor with a transistor in a single trench region, represented schematically at FIG. 4. As described more fully below, a portion of the trench may be excavated to permit formation of a capacitor within the excavated region. Consequently, the capacitor is formed integral within the trench region. In a further embodiment the integrated MOS transistor/capacitor is connected to a separately formed trench gate complementary MOS transistor. The connections between the trench regions produces a complimentary MOS circuit with a series capacitor, as schematically represented in FIG. 5.

FIGS. 6-15 illustrate the construction of an integrated trench gate transistor/capacitor conforming to the schmatic representation of FIG. 4. The construction proceeds as follows.

First, trench 31 is formed in substrate 20. In the presently preferred embodiment the substrate is formed of p-type bulk silicon. An insulating layer 33 is then disposed on the surfaces of trench 31. The insulating layer 33 may, for example, be a layer of silicon dioxide ($SiO_2$) formed by thermally oxidizing the silicon substrate. Next, a first layer of conductive material 35, e.g. degenerately doped polycrystalline silicon, is disposed upon the insulating layer 33. In the presently preferred embodiment the first doped layer 35 is formed by chemical vapor deposition of degenerately doped polycrystalline silicon.

Figure 9:
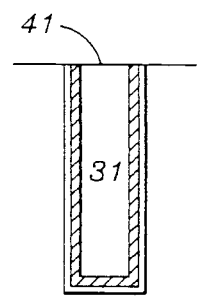
Figure 10:
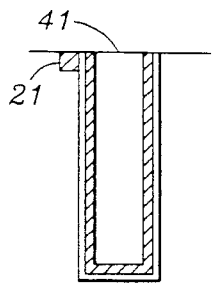

As shown in FIG. 9, the trench 31 is filled with a body of insulating material 41. The insulating material may be silicon dioxide, applied by vapor deposition. Next, a source region 21 is formed in the substrate 20, e.g. by diffusing n-type dopant into the upper surface of the substrate 20 adjacent insulating layer 33, as shown at FIG. 10.

Figure 11:
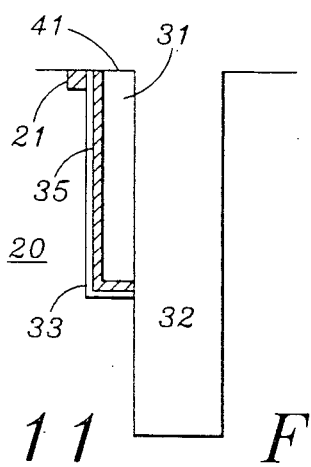
Figure 12:
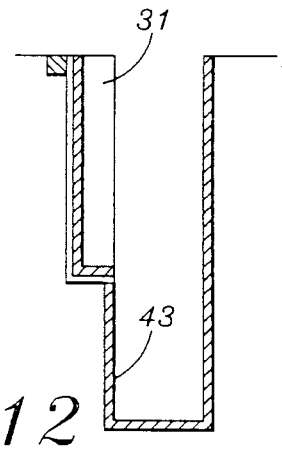

A second trench 32 is then formed in the substrate 20. The trench 32 may be formed by means such as reactive ion etching. Trench 32, as illustrated at FIG. 11, slices a portion of trench 31, including insulating body 41, insulating layer 33 and first conductive layer 35. A first doped layer 43 is then formed by diffusion at the silicon surfaces of trench 32, as illustrated at FIG. 12.

Figure 13:
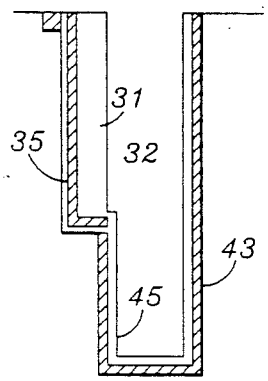

As shown at FIG. 13, a second insulating layer 45 is then formed within trench 32 over layers 43 and 35 by thermally oxidizing these exposed silicon surfaces. Alternatively, an insulator layer of silicon dioxide or silicon nittride can be chemical vapor deposited over the trench walls and floor. The trench 32 may then be filled with a body of conductive material 47, such as degenerately doped polysilicon, as shown at FIG. 14.

Figure 14:
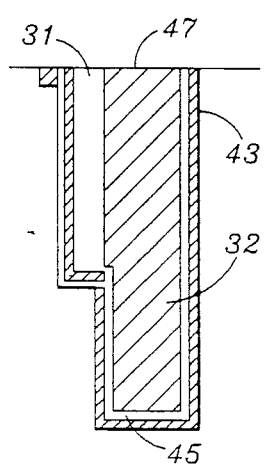
Figure 15:
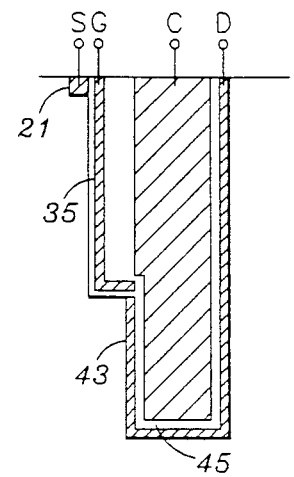

As a consequence of the construction set forth at FIG. 14 an integrated trench gate MOS transistor/capacitor may be viewed as being formed, with the capacitor in series with the drain of the transistor. As illustrated at FIG. 15 the transistor source is represented as doped region 21 and the gate is represented as first conductive layer 35. The drain of the transistor is represented as first doped layer 43. An optional surface contact to layer 43 is included in FIG. 15. The construction of doped layer 43 and insulating body 47, separated by insulating layer 45, may be viewed as a capacitor, disposed in series with the transistor gate. Consequently, an output terminal connected to the body 47 may be viewed as an output from the transistor drain, passing through a series capacitor. Thus, the construction illustrated at FIG. 15 may be schematically represented by the circuit illustrated at FIG. 4.

As a consequence of the construction illustrated at FIG. 15 a trench gate MOS transistor is formed integral with a trench capacitor. Thus, the advantages of low 1/f noise and high capcitance are achieved while minimizing the surface area needed to provide such a construction. As described below, in connection with FIGS. 16 and 17, the integral MOS trench transistor/capacitor may further be connected to an adjacent trench gate complementary MOS transistor, similarly constructed in accordance with FIG. 2.

The resulting construction may be represented by the schematic diagram set forth at FIG. 5.

Figure 16:
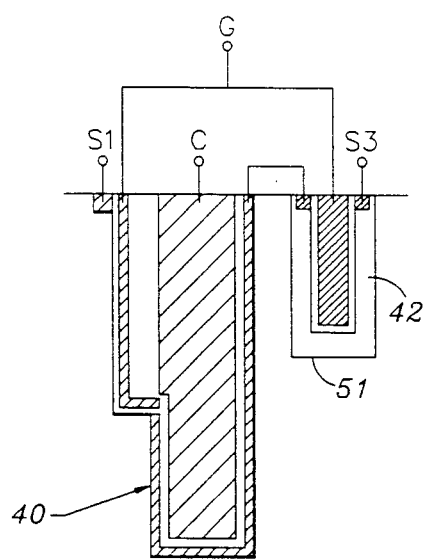
FIGS. 16 and 17 illustrate the construction of CMOS transistors wherein the single trench MOSFET capacitor cell is supplemented for the formation of an adjacent trench gate transistor to provide a construction equivalent to the schematic representation set forth at FIG. 5.
Figure 17:
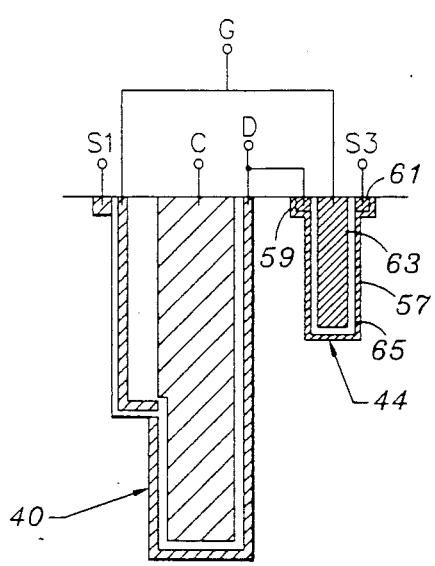

FIGS. 16 and 17 illustrate the construction and interconnection of an adjacent trench gate complementary MOS transistor interconnected to the structure illustrated at FIG. 15. The second or trench gate complementary MOS transistor 42 can be constructed as illustrated at FIG. 16. First a well region 51 of opposite type to the substrate 20 is formed by a deep dopant diffusion. In the presently preferred embodiment the well 51 is doped to be n-type. The transistor formation in the well then follows the device fabrication procedures in accordance with FIG. 2, except the source and drain regions are of opposite type. In the present preferred embodiment, the source and drain regions are p-type.

FIG. 17 illustrates a construction similar to that set forth at FIG. 16, except that the formation of well 51 is avoided by formation of a doped layer 57 by dopant diffusion, e.g., n-type in the presently preferred embodiment, at the trench and substrate surfaces adjacent to the trench. It extends about the remaining portions of the MOS transistor 44. It thus forms the MOS transistor channels and isolates the transistor from the substrate 20. In the embodiments illustrated at FIGS. 16 and 17 the source 59 and drain 61 are formed of p-doped material and the gate 63 is formed of a conductive material such as degenerately doped polycrystalline silicon. Insulating layer 65 is formed of silicon dioxide, e.g. by thermally oxidizing the surface of doped silicon layer 57.

The connections between the integrated trench gate MOS transistor/capacitor 40 and the adjacent trench gate MOS transistors 42 (FIG. 16) or 44 (FIG. 17) can both be represented schematically by the circuit set forth at FIG. 5.

It should be understood that the techniques and structures provided by the present invention can be duplicated and interconnected in a variety of different ways to provide a variety of circuits other than those set forth at FIGS. 4 and 5. Additionally, the techniques of the present invention may be utilized to provide transistor/capacitor cells of different types than those illustrated at FIGS. 3, 15, 16 and 17. Accordingly, the specific embodiments set forth in the drawings as described above are presented as sample implementations of the present invention and are not intended to define the scope of all possible embodiments that may be implemented in accordance with the invention.

The relative areas in the trench of the transistor channel or gate region and the capacitor are approximately as shown in FIGS. 13 et seq. The capacitor area is large since it is used to store the charge of the amplified signal. The transistor area is only as great as needed to reduce 1/f noise.

The trench areas, and approximately the linear dimensions, of the two transistors should be the same. Therefore, the trench of the complimentary transistor is made less deep than the transistor integrated with the capacitor, where the gate region is cut off by the extended trench.

Different results can be achieved by changing the depth of the initially cut trench in the integrated transistor/capacitor structure, since the speed of the transistor is increased the shallower this initially formed trench. The trench will then be broader if the channel area is to be retained. As discussed above, the dimensions of the complimentary transistor channel area would be modified accordingly. That is, a reduction in the depth of one transistor is matched to the other.

The transistor gate and the capacitor electrode are isolated. Thermal oxidation of the gate silicon should mushroom out sufficiently to prevent contact. Further, an alternative way of making the insulator film is by chemical vapor deposition of either silicon dioxide or silicon nitride.

What is claimed is:

1. A method of forming an integral trench gate MOS field effect transistor/capacitor having improved 1/f noise characteristics for amplifying the low level signals output from an infrared detector element, said method comprising the steps of:

forming a first trench in a semiconductor substrate, said trench being between 10 to 20 microns deep, between 2 to 3 microns wide, and between 10 to 20 microns long;

doping a first region adjacent an upper surface of the first trench, the uppermost surface of said first region forming an accessible source electrode;

applying a first layer of insulator on the surface of the first trench;

forming a first layer of conductive material on the surface of the first trench above the insulating layer, a portion of the uppermost surface of said first layer of conductive material forming an accessible gate electrode, said gate electrode being connectable to a source of infrared detector element output signals;

forming a body of insulating material filling the first trench upon the first layer of conductive material;

forming a second trench in a semiconductor substrate, said second trench extending through a portion of said first trench and thereby excavating a portion of said first trench;

forming a first layer of doped material along the surface of said second trench, said first layer being isolated from said first layer of conductive material, said first doped layer being doped to a conductivity type opposite of the substrate, the uppermost surface of said first layer of doped material forming an accessible drain electrode and an accessible capacitor electrode;

forming a second layer of insulator within said second trench upon the surface of said first doped layer;

filling the second trench with a body of conductive material such that a capacitor is formed of said first layer of doped material, said second layer of insulator, and said body of conductive material, the uppermost surface of said first layer forming an accessible capacitor counterelectrode;

wherein the gate region is formed of sufficient area to mitigate the introduction of 1/f noise into the low level signal output from the infrared detector element during the low frequency operation of the transistor.

2. The process as recited in claim 1 wherein the first trench is formed to be approximately 10 microns high, 2-3 microns wide and 20 microns long.

3. The process as recited in claim 1 wherein the body of insulating material completely fills the first trench above the first conductive layer.

4. The process as recited in claim 1 wherein the first trench is formed by reactive ion etching.

5. The process as recited in claim 4 wherein the first insulating layer is formed by thermally oxidizing the silicon substrate exposed by the trench.

6. The process as recited in claim 5 wherein the first doped region is formed by diffusing dopants in the semiconductor substrate.

7. The process as recited in the claim 6 wherein the first layer of conductive material is formed by a chemical vapor deposition of a highly doped semiconductor.

8. The process as recited in claim 1 further comprising the step of forming a second trench gate MOS transistor within the substrate adjacent said integral transistor/capacitor and interconnecting said integral transistor/capacitor and said second transistor to form complimentary trench gate MOS transistors having a capacitor in series with drain terminals of both the integral transistor/capacitor and the transistor.

9. The method as recited in claim 5 wherein said step of forming the trench gate MOS transistor further comprises:

forming a third trench in the semiconductor substrate;

doping second and third regions adjacent the upper surface of said substrate on opposite sides of the third trench;

forming a second layer of doped material about said third trench and about said second and third regions, said layer of doped material being effective to isolate said second and third regions from the substrate;

forming a second layer of insulator on the surface of said third trench above the second layer of doped material; and filling said third trench with a body of conductive material upon said second layer of insulator; and wherein said second and third regions form source and drain regions respectively, of the second transistor, and wherein said body of conductive material forms a transistor gate.

10. The process as recited in claim 9 wherein said step of forming said second layer of doped material comprises counterdoping segments of second and third doped regions after forming said second layer of doped material.

11. The process as recited in claim 9 wherein the third trench is formed to be between approximately 5 to 10 microns deep.

12. The process as recited in claim 9 wherein the third trench is formed to be between approximately 2 to 3 microns wide.

13. The process as recited in claim 9 wherein the third trench is formed to be between approximately 10 to 20 microns long.

14. The process as recited in claim 9 wherein the third trench is formed to be approximately 10 microns deep, 2 microns wide and 10 microns long.

15. The process as recited in claim 9 wherein the third trench is formed by reactive ion etching.

16. The process as recited in claim 9 wherein said second insulating layer is formed by thermally oxidizing the silicon substrate exposed by the third trench.

17. The process as recited in claim 9 wherein the transistor gate and source regions are formed by diffusing dopants in the semiconductor substrate.

18. The process as recited in the claim 17 wherein the body of conductive material is formed by a vapor deposition.

19. The process as recited in claim 9 wherein the body of conductive material completely fills the third trench within the second insulating layer.

* * * * *